(12) United States Patent
Wang et al.

(10) Patent No.: US 10,854,450 B2
(45) Date of Patent: Dec. 1, 2020

(54) METHODS FOR REPAIRING SUBSTRATE LATTICE AND SELECTIVE EPITAXY PROCESSING

(71) Applicant: Yangtze Memory Technologies Co., Ltd., Hubei (CN)

(72) Inventors: Xiao Jun Wang, Hubei (CN); Wei Zhou, Hubei (CN); Lin Kang Xu, Hubei (CN); Guan Nan Li, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/655,617

(22) Filed: Oct. 17, 2019

(65) Prior Publication Data

US 2020/0051816 A1 Feb. 13, 2020

Related U.S. Application Data

(60) Division of application No. 16/046,717, filed on Jul. 26, 2018, now Pat. No. 10,515,799, which is a
(Continued)

(51) Int. Cl.
*H01L 21/02* (2006.01)
*H01L 21/265* (2006.01)
(Continued)

(52) U.S. Cl.
CPC .... *H01L 21/02645* (2013.01); *H01L 21/0245* (2013.01); *H01L 21/02513* (2013.01);
(Continued)

(58) Field of Classification Search
None
See application file for complete search history.

(56) References Cited

U.S. PATENT DOCUMENTS

| 2006/0240656 A1 | 10/2006 | Ahn |
| 2010/0015766 A1 | 1/2010 | McMullan et al. |

(Continued)

FOREIGN PATENT DOCUMENTS

| CN | 1893016 A | 1/2007 |
| CN | 101989046 A | 3/2011 |

(Continued)

OTHER PUBLICATIONS

Search Report for Chinese Application No. 201880000844.2, Chinese Patent Office, dated Apr. 24, 2019, 2 pages.
(Continued)

*Primary Examiner* — Thien F Tran
(74) *Attorney, Agent, or Firm* — Sterne, Kessler, Goldstein & Fox P.L.L.C.

(57) ABSTRACT

The present disclosure describes patterned devices and methods for repairing substrate lattice damage in a patterned device. The patterned device includes a substrate, an alternating conductor and dielectric stack atop the substrate, a channel hole extending through the alternating conductor and dielectric stack to the substrate, and an epitaxial grown layer at a bottom of the channel hole and a top surface of the substrate. A part of the substrate in contact with the epitaxial grown layer has a dopant or doping concentration different from an adjacent part of the substrate. The method includes forming a channel hole in an insulating layer atop a substrate, forming an amorphous layer in a top side of the substrate below the channel hole, heating to crystallize the amorphous layer, and growing an epitaxial layer on the crystallized layer in the channel hole.

14 Claims, 5 Drawing Sheets

Related U.S. Application Data continuation of application No. PCT/CN2018/088247, filed on May 24, 2018.

(51) Int. Cl.
*H01L 21/311* (2006.01)
*H01L 27/115* (2017.01)

(52) U.S. Cl.
CPC .. *H01L 21/02658* (2013.01); *H01L 21/26513* (2013.01); *H01L 21/26533* (2013.01); *H01L 21/31116* (2013.01); *H01L 27/115* (2013.01)

(56) References Cited

U.S. PATENT DOCUMENTS

| | | | |
|---|---|---|---|
| 2011/0233631 A1 | 9/2011 | Son et al. | |
| 2012/0138897 A1* | 6/2012 | Lin | H01L 21/02381 257/19 |
| 2016/0056169 A1* | 2/2016 | Lee | H01L 27/11578 438/269 |
| 2016/0099155 A1 | 4/2016 | Park et al. | |
| 2016/0181259 A1 | 6/2016 | Van Houdt et al. | |
| 2019/0123054 A1 | 4/2019 | Chen et al. | |

FOREIGN PATENT DOCUMENTS

| | | |
|---|---|---|
| CN | 105514158 A | 4/2016 |
| CN | 105575808 A | 5/2016 |
| CN | 106910746 A | 6/2017 |
| CN | 106920794 A | 7/2017 |
| CN | 107731824 A | 2/2018 |
| CN | 107996000 A | 5/2018 |
| TW | 201721921 A | 6/2017 |

OTHER PUBLICATIONS

Office Action for Chinese Application No. 201880000844.2, Chinese Patent Office, dated May 5, 2019, 18 pages.
International Search Report and Written Opinion for International Application No. PCT/CN2018/088247, Chinese Patent Office, Beijing, dated Feb. 25, 2019, 11 pages.
Office Action for Chinese Application No. 201880000844.2, Chinese Patent Office, dated Apr. 20, 2020, 10 pages.
Office Action for Chinese Application No. 201880000844.2, Chinese Patent Office, dated Feb. 3, 2020, 16 pages.

\* cited by examiner

METHODS FOR REPAIRING SUBSTRATE LATTICE AND SELECTIVE EPITAXY PROCESSING

CROSS REFERENCE TO RELATED APPLICATIONS

This application is a divisional of U.S. patent application Ser. No. 16/046,717, filed Jul. 26, 2018, which is a continuation of International Application No. PCT/CN2018/088247, filed May 24, 2018, the disclosures of which are hereby incorporated by reference in their entireties.

BACKGROUND

Epitaxy is the growth of a crystalline layer, typically from a seed layer. Selective epitaxial growth (SEG) is one type of epitaxy adapted for growth of a single crystalline layer on only a selected portion(s) of a substrate called seed window areas in a channel hole. The surface of the substrate can be selectively exposed by removing an intervening protective layer to form a seed window area. With the scaling down of device dimensions, such as for three-dimensional (3D) NAND flash memory devices, reduced seed window area dimensions and SEG pre-cleaning processes can cause non-uniformity in the substrate surface. In particular, SEG pre-cleaning processes can greatly affect the epitaxial growth rate and thickness of an epitaxial layer in the seed window area, as well as corrode the channel hole.

Significant substrate lattice damage can occur when a channel hole is formed in a patterned device. Normally hydrogen chloride (HCl) gas will be used to remove a damaged substrate. However, it is hard to control the HCl flow. If the HCl gas flow is too high, an undamaged substrate will also be removed and the channel hole CD (Critical Dimension) will be enlarged and the device performance may shift. If the HCl gas flow is too low, unwanted growth of silicon will occur on the sidewalls of the channel hole and block the channel hole. Both conditions can affect overall product yield. Further, the thermal budget (i.e., maximum temperature) of subsequent processes for repair of a damaged substrate lattice is limited. The non-uniformity in substrate surface makes device processing difficult to control and can adversely affect device performance.

BRIEF SUMMARY

Embodiments of patterned devices and fabrication methods thereof are disclosed herein.

In some embodiments, a patterned device includes a substrate, an alternating conductor and dielectric stack atop the substrate, a channel hole extending through the alternating conductor and dielectric stack to the substrate, and an epitaxial grown layer at a bottom of the channel hole and a top surface of the substrate. A part of the substrate in contact with the epitaxial grown layer has a dopant or doping concentration different from an adjacent part of the substrate.

In some embodiments, the alternating conductor and dielectric stack includes alternating conductor and dielectric layers. The dopant of the part of the substrate in contact with the epitaxial grown layer includes one or more of III element, IV element, and V element. The dopant of the part of the substrate in contact with the epitaxial grown layer includes one or more of silicon, carbon, boron, phosphorus, and germanium.

In some embodiments, a method for repairing substrate lattice damage in a patterned device includes forming a channel hole in an insulating layer atop a substrate, forming an amorphous layer in a top side of the substrate below the channel hole, heating to crystallize the amorphous layer, and growing an epitaxial layer on the crystallized layer in the channel hole. Forming the channel hole includes using an anisotropic reactive ion etch. The method further includes cleaning the channel hole after the channel hole is formed. Cleaning the channel hole includes a process selected from the group consisting of plasma etching, hydrogen chloride etching, and hydrogen fluoride etching.

In some embodiments, forming the amorphous layer includes ion implantation. The total dosage of the implantation is greater than $5 \times 10^{15}$ ion/cm$^3$. The implant temperature is $-100°$ C. to $23°$ C. The implant energy is 25 keV to 250 keV. The implanted material includes one or more of III element, IV element, V element, and inert element. The implanted material includes one or more of silicon, carbon, boron, phosphorus, germanium, and argon.

In some embodiments, the ion implantation includes multiple sub-processes. The multiple sub-processes include a first sub-process and a second sub-process. In the first sub-process, one or more of III element is implanted with a comparatively lower energy. In the second sub-process, one or more of V element is implanted with a comparatively higher energy.

In some embodiments, heating the amorphous layer includes annealing. Annealing includes a temperature of $600°$ C. to $800°$ C. Annealing includes a duration of 20 sec to 200 sec. The insulating layer includes alternating first and second insulating layers.

In some embodiments, a method for repairing substrate lattice damage in a patterned device includes forming a channel hole in an alternating dielectric stack atop a substrate, forming an amorphous layer in the substrate by ion implantation through the channel hole, transforming the amorphous layer to a crystallized layer by crystallizing the amorphous layer through solid-phase epitaxy, and growing an epitaxial layer with the crystallized layer as a seed layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
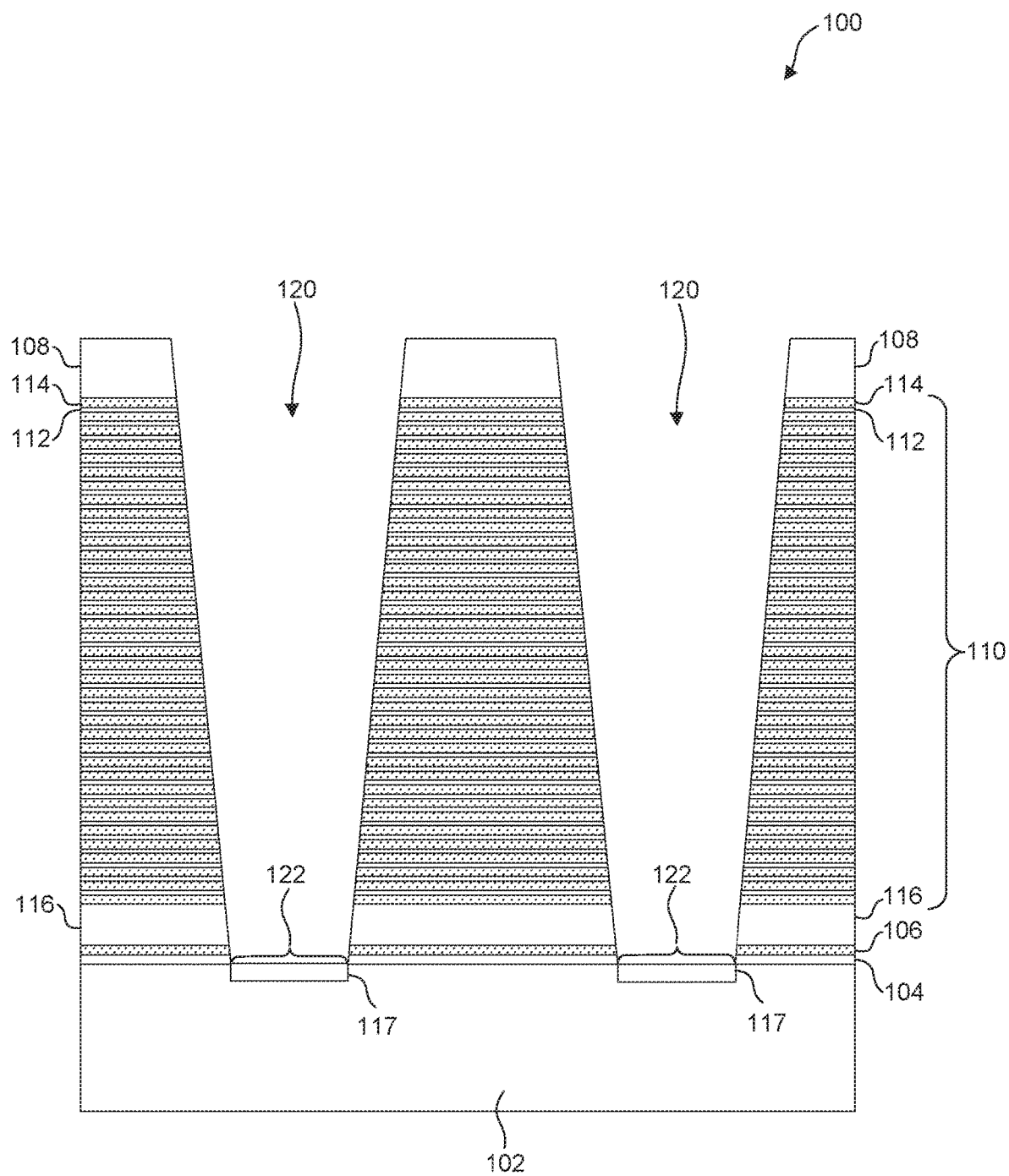
FIG. 1 illustrates a cross-section of a patterned device, according to some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "patterned device" refers to a semiconductor device with vertically oriented layers on a laterally oriented substrate so that the layers extend in the vertical direction with respect to the substrate. As used herein, the term "vertical/vertically" means nominally perpendicular to the lateral surface of a substrate.

Epitaxy is the growth of a crystalline layer, typically from a seed layer. Epitaxy includes homoepitaxy (i.e., one material), heteroepitaxy (i.e., two or more different materials), heterotopotaxy (i.e., form of 3D growth), pendeo-epitaxy (i.e., form of 3D), or other equivalent forms. SEG is one type of epitaxy adapted for growth of a single crystalline layer on only a selected portion(s) of a substrate called seed window areas in a channel hole. SEG is controlled by differential nucleation, and can be effected by substrate lattice non-uniformity, sidewall faceting, and defect generation. Seed window area refers to the two-dimensional size of an exposed surface where an epitaxial layer is to be grown. When seed window area dimensions are similar in magnitude to the diffusion length of growth component adatoms (i.e., atom on a crystal surface), the impact of the seed window area on epitaxial growth rate is significant. The surface of the substrate can be selectively exposed by removing an intervening protective layer to form a seed window area. The basis of SEG processes is to arrange suitable implantation conditions such that single crystal growth occurs at a reasonable rate in each respective seed window area.

With the scaling down of device dimensions, such as for three-dimensional 3D NAND flash memory devices, reduced seed window area dimensions and SEG pre-cleaning processes can cause non-uniformity in the substrate surface. SEG pre-cleaning processes can greatly affect the epitaxial growth rate and thickness of an epitaxial layer in the seed window area, as well as corrode the channel hole. Significant substrate lattice damage can occur when a channel hole is formed in a patterned device. Due to lattice damage of the substrate and non-uniformity of the lattice damage, the SEG rate can be affected and result in inconsistencies for each channel hole in a patterned device, which can affect overall product yield. Further, the thermal budget (i.e., maximum temperature) of subsequent processes for repair of a damaged substrate lattice is limited. The non-uniformity in substrate surface makes device processing difficult to control.

To form high aspect ratio trenches in a patterned device, etch processes can damage the substrate interface and affect epitaxial growth. To improve the substrate interface post-etch, SEG pre-cleaning treatment can be used to clean the native oxide and substrate grains. For example, diluted hydrofluoric acid (DHF) can be used for removing native oxide and high temperature HCl gas can be used for removing damaged silicon. However, a large flow of etchant (e.g., HCl) may damage or corrode the silicon channel hole during the process. Further, for a low flow of etchant (e.g., HCl) channel hole corrosion can be reduced, but the SEG growth selectivity will be reduced correspondingly, which means some unwanted silicon defects can grow on the channel hole sidewalls. These defects can block the channel hole and lead to device failure. The non-uniformity in epitaxial layer thickness and surface roughness of substrate lattice areas post-cleaning makes device processing difficult to control and may adversely affect device performance. Further, epitaxial growth may not occur at certain substrate lattice areas, which could cause current leakage at a bottom or dummy selective gate in the patterned device.

Solid-phase epitaxy (SPE) is a transition between an amorphous phase and a crystalline phase of a material, for example, a silicon film. Typically, SPE occurs at an interface of amorphous silicon and crystalline silicon. The substrate is heated to crystallize the film, for example, by rapid thermal annealing (RTA). When lattice damage of the film is minor, the damaged layer becomes polysilicon. Although most of the lattice damage can be repaired by heating, some defects can still remain. However, when the damaged layer becomes amorphous silicon, SPE occurs and defects caused by lattice damage can be minimized.

The present disclosure describes embodiments of patterned devices and methods to repair or reduce substrate lattice damage. The disclosed methods and structures can be incorporated into fabricated devices, for example, 3D NAND memory devices.

FIG. 1 illustrates patterned device 100, according to an exemplary embodiment. Patterned device 100 can include substrate 102, first bottom insulating layer 104, second bottom insulating layer 106, intermediate insulating layer 116, alternating insulating layer 110, top insulating layer 108, and channel hole 120. Patterned device 100 demonstrates channel holes 120 with exposed seed window areas 122 on substrate 102. Channel hole 120 extends through top insulating layer 108, alternating insulating layer 110, intermediate insulating layer 116, second bottom insulating layer 106, and first bottom insulating layer 104 to expose substrate 102.

First bottom insulating layer 104 is formed atop substrate 102. Second bottom insulating layer 106 is formed atop first bottom insulating layer 104. Intermediate insulating layer 116 is formed atop second bottom insulating layer 106. Alternating insulating layer 110 is formed atop intermediate insulating layer 116. Alternating insulating layer 110 can include first patterned insulating layer 112 and second patterned insulating layer 114 in a vertically alternating stacked pattern. As shown in FIG. 1, patterned device 100 can additionally include top insulating layer 108. Top insulating layer 108 is disposed atop alternating insulating layer 110.

In some embodiments, substrate 102 can be made of silicon. In some embodiments, substrate 102 includes any suitable material for forming patterned device 100. For example, substrate 102 can include silicon, silicon germanium, silicon carbide, silicon on insulator (SOI), germanium on insulator (GOI), glass, gallium nitride, gallium arsenide, and/or other suitable III-V compound.

In some embodiments, first bottom insulating layer 104, second bottom insulating layer 106, intermediate insulating layer 116, and alternating insulating layer 110 can be a single insulating layer. In some embodiments, first bottom insulating layer 104, second bottom insulating layer 106, intermediate insulating layer 116, and/or top insulating layer 108 can be made of silicon oxide. In some embodiments, first bottom insulating layer 104, second bottom insulating layer 106, intermediate insulating layer 116, alternating insulating layer 110, and/or top insulating layer 108 can be any suitable dielectric material including silicon oxide, silicon nitride, silicon oxynitride, organosilicate glass, spin-on-glass (SOG), and/or any other suitable dielectric materials. In some embodiments, first bottom insulating layer 104, second bottom insulating layer 106, intermediate insulating layer 116, alternating insulating layer 110, and/or top insulating layer 108 can be formed or deposited by any suitable methods including chemical vapor deposition (CVD), plasma-enhanced CVD (PECVD), low pressure CVD (LPCVD), atomic layer deposition (ALD), pulsed laser deposition (PLD), liquid source misted chemical deposition, and/or other suitable deposition methods. In some embodiments, alternating insulating layer 110 can be an alternating conductor and dielectric stack. For example, second patterned insulating layer 114 can be a conductor (e.g., polysilicon, tungsten, tantalum, copper, etc.) and first patterned insulating layer 112 can be a dielectric (e.g., silicon oxide, silicon nitride, etc.). In some embodiments, alternating insulating layer 110 can be selectively etched and then formed with a conductor. For example, second patterned insulating layer 114 can be selectively etched and removed, and a conductor (e.g., polysilicon, tungsten, tantalum, copper, etc.) can be formed in the corresponding place of second patterned insulating layer 114.

In some embodiments, first patterned insulating layer 112 can be made of silicon oxide and second patterned insulating layer 114 can be made of silicon nitride. In some embodiments, second patterned insulating layer 114 can include any suitable material different from first patterned insulating layer 112. For example, second patterned insulating layer 114 can include poly-crystalline silicon, silicon nitride, poly-crystalline germanium, and/or poly-crystalline germanium-silicon. In some embodiments, second patterned insulating layer 114 can include silicon nitride. In some embodiments, first patterned insulating layer 112 can include any suitable insulating materials, for example, silicon oxide.

In some embodiments, alternating insulating layer 110 includes an alternating stack of first patterned insulating layer 112 (i.e., first element or first material) and second patterned insulating layer 114 (i.e., second element or second material), arranged vertically (along z-axis) over substrate 102. In some embodiments, first patterned insulating layer 112 and corresponding underlying second patterned insulating layer 114 are referred to as an element pair or material pair. In some embodiments, second patterned insulating layer 114 is a sacrificial layer, to be removed subsequently for disposing gate metal material for forming patterned structures, for example, wordlines. In some embodiments, alternating insulating layer 110 can be formed by alternatingly disposing first patterned insulating layer 112 and second patterned insulating layer 114 over substrate 102. For example, first patterned insulating layer 112 can be disposed over substrate 102, first bottom insulating layer 104, second bottom insulating layer 106, or intermediate insulating layer 116, and second patterned insulating layer 114 can be disposed on first patterned insulating layer 112, and so on and so forth. In some embodiments, alternating insulating layer 110 can be formed or deposited by any suitable methods including CVD, PECVD, LPCVD, ALD, PLD, liquid source misted chemical deposition, and/or other suitable deposition methods.

In some embodiments, patterned device 100 can include a plurality of channel holes 120. In some embodiments, channel hole 120 can be formed by etching. For example, channel hole 120 can be formed by anisotropic reactive ion etching (RIE). In some embodiments, the etching of top insulating layer 108, alternating insulating layer 110, intermediate insulating layer 116, second bottom insulating layer 106, and/or first bottom insulating layer 104 can be performed in one etching process or different etching processes. For example, the etching processes can be plasma processes, for example, RIE using oxygen-based plasma. In some embodiments, RIE process can include etchant gas, for example, carbon tetrafluoride ($CF_4$), sulfur hexafluoride ($SF_6$), fluoroform ($CHF_3$), and/or other suitable gases. Numerous other etching methods can also be suitable. In some embodiments, channel hole 120 can be formed by using a mask, for example, a photoresist mask that can be patterned, and etching portions top insulating layer 108, alternating insulating layer 110, intermediate insulating layer 116, second bottom insulating layer 106, and/or first bottom insulating layer 104 exposed by the patterned mask using a suitable etching process, e.g., dry etch. In some embodiments, damaged layer 117 is formed in the top side of substrate 102 due to lattice damage in the etching process. In some embodiments, channel hole 120 can be through top insulating layer 108, alternating insulating layer 110, intermediate insulating layer 116, second bottom insulating layer 106, and/or first bottom insulating layer 104 and substantially into substrate 102. The mask can be removed after channel hole 120 is formed.

In some embodiments, channel hole 120 can undergo SEG pre-cleaning to clean the native oxide and damaged layer 117 from the previous etching process. For example, HCl etching, HF etching, BOE, BHF etching, or plasma etch cleaning can be used to remove the native silicon oxide layer and any broken silicon grains.

Figure 2:
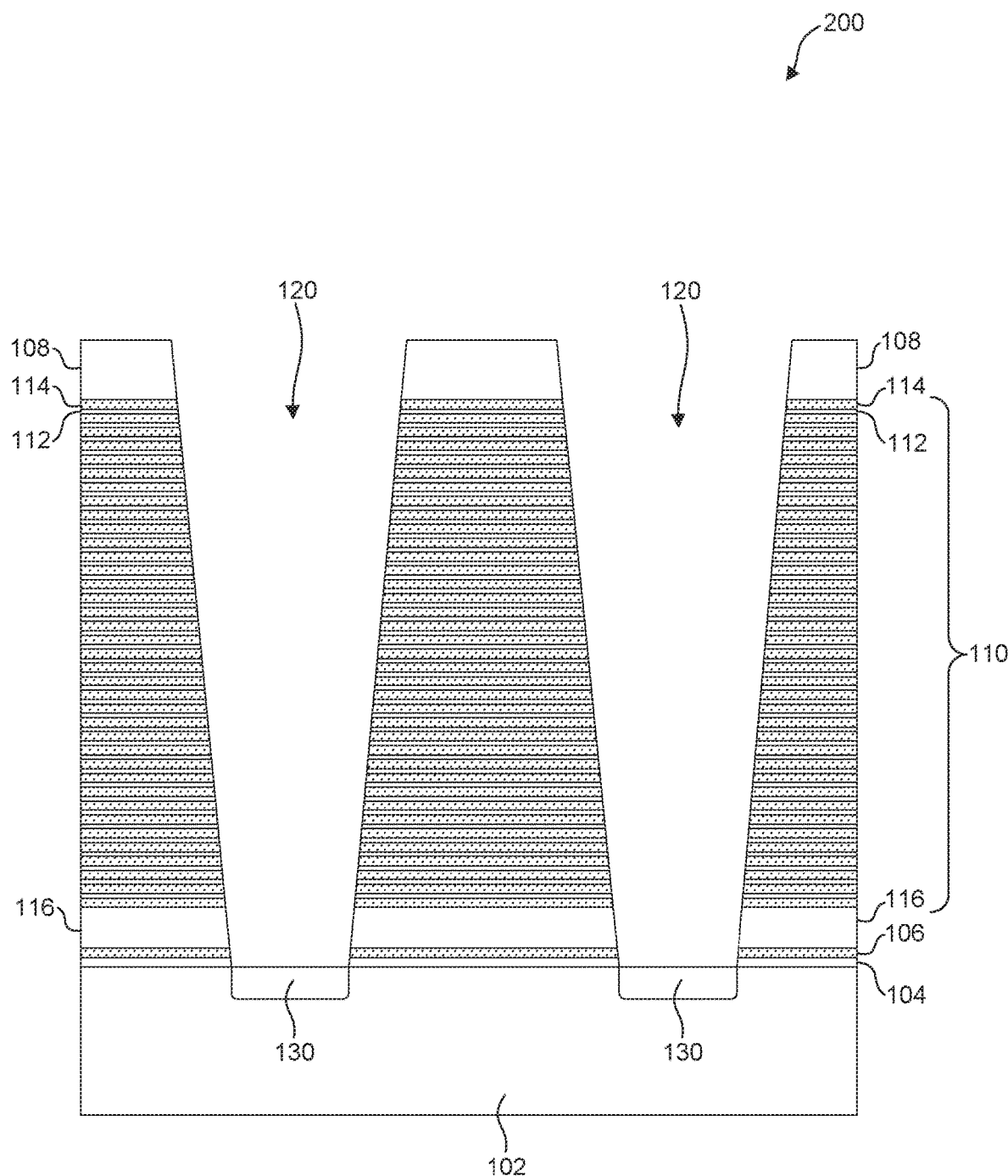
FIG. 2 illustrates a cross-section of a patterned device, according to some embodiments.
Figure 3:
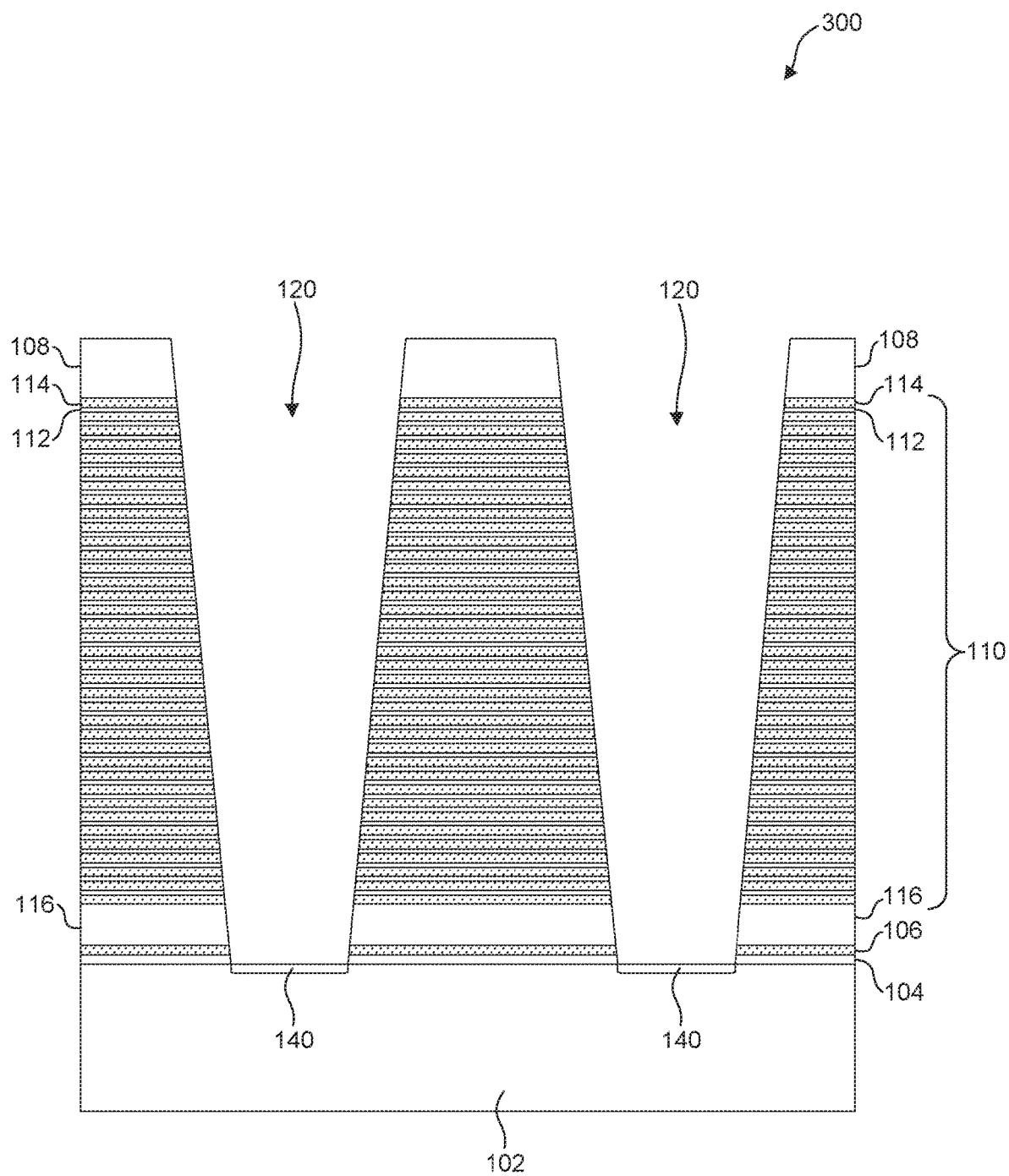
FIG. 3 illustrates a cross-section of a patterned device, according to some embodiments.
Figure 4:
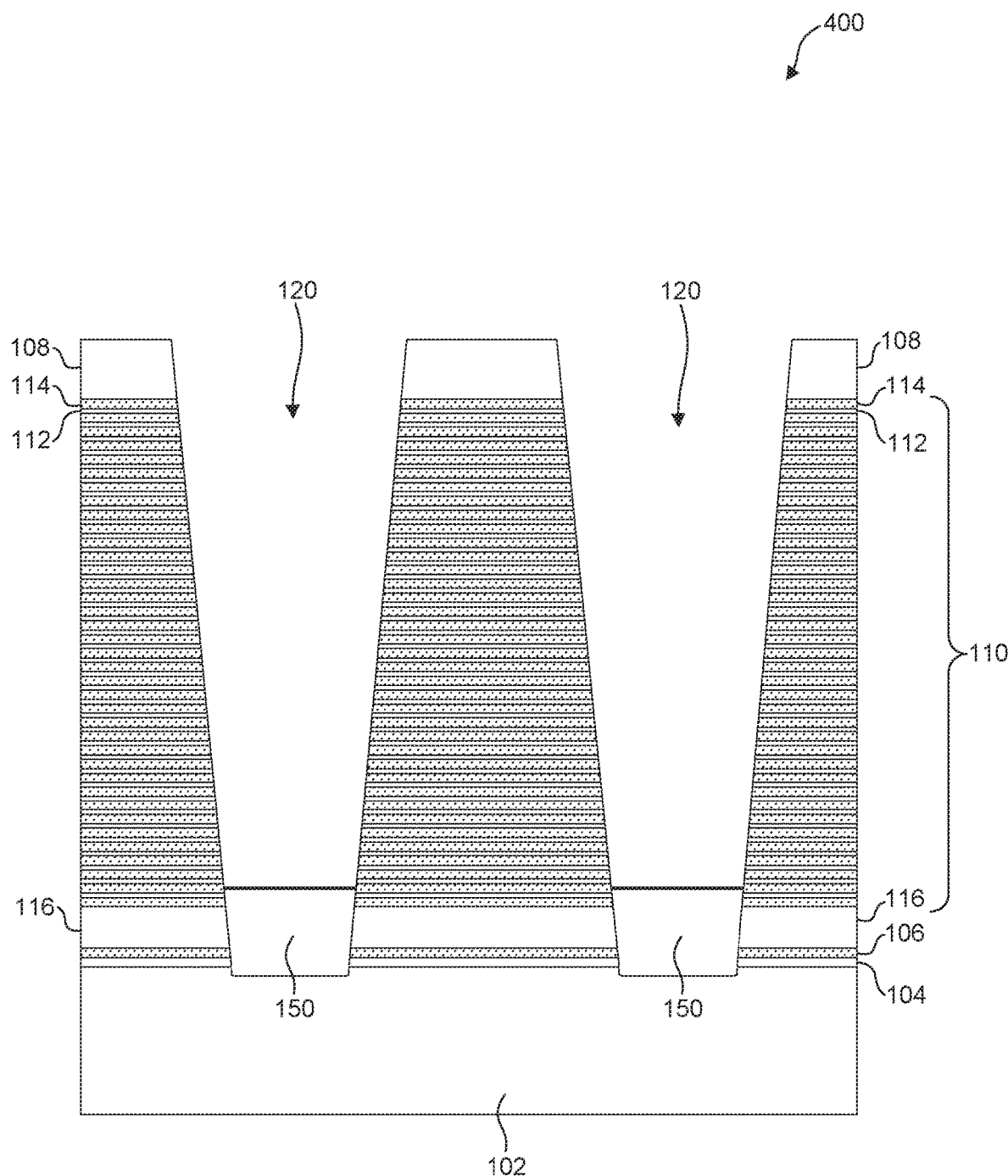
FIG. 4 illustrates a cross-section of a patterned device, according to some embodiments.

FIGS. 2-4 illustrate embodiments of patterned devices to repair or reduce substrate lattice damage. FIGS. 2-4 illustrate patterned device 200, 300, 400, according to embodiments. The embodiments of patterned device 200, 300, 400 shown in FIGS. 2-4 and the embodiments of patterned device 100 shown in FIG. 1 are similar. Similar reference numbers are used to indicate similar features of the embodiments of patterned device 200, 300, 400 shown in FIGS. 2-4 and similar features of the embodiments of patterned device 100 shown in FIG. 1.

The main difference between the embodiments of patterned device 200 shown in FIG. 2 and the embodiments of patterned device 100 shown in FIG. 1 is the addition of amorphous layer 130 and the omission of damaged layer 117. The main difference between the embodiments of patterned device 300 shown in FIG. 3 and the embodiments of patterned device 100 shown in FIG. 1 is the addition of annealed layer 140. The main difference between the embodiments of patterned device 400 shown in FIG. 4 and the embodiments of patterned device 100 shown in FIG. 1 is the addition of selective epitaxial layer 150.

Referring to FIG. 2, patterned device 200 is similar to patterned device 100 of FIG. 1. FIG. 2 illustrates patterned device 200, according to an exemplary embodiment. Patterned device 200 includes amorphous layer 130. As shown in FIG. 2, amorphous layer 130 can be ion implanted into damaged layer 117 of FIG. 1 below channel hole 120.

In some embodiments, amorphous layer 130 can be ion implanted into substrate 102. For example, amorphous layer 130 can be shallow ion implanted into substrate 102. For example, amorphous layer 130 can be deep ion implanted into substrate 102. In some embodiments, implanted material includes one or more of III element, IV element, V element, and inert element. For example, implanted material can be one or more of silicon, carbon, boron, phosphorus, germanium, and argon. In some embodiments, carbon is implanted into substrate 102 to form amorphous layer 130 and to reduce stress. In some embodiments, one or more of III element and V element is implanted into substrate 102 to form amorphous layer 130 and to improve electrical performance. In some embodiments, the material can be implanted with an implant energy of 25 keV to 250 keV. In some embodiments, total dosage of the implantation is higher than $5 \times 10^{15}$ ion/$cm^3$. In some embodiments, implant temperature is −100° C. to 23° C. In some embodiments, the implant process includes multiple sub-processes. For example, the implant process includes a first sub-process and a second sub-process. For example, in the first sub-process, one or more of III element is implanted with a comparatively lower energy, and in the second sub-process, one or more of V element is implanted with a comparatively higher energy.

Referring to FIG. 3, patterned device 300 is similar to patterned device 100 of FIG. 1. FIG. 3 illustrates patterned device 300, according to an exemplary embodiment. Patterned device 300 includes annealed layer 140 (also known as crystallized layer). Annealed layer 140 is the result of annealing amorphous layer 130, for example, by RTA. In some embodiments, amorphous layer 130 can be annealed at 600° C. to 800° C. for 20 sec to 200 sec to form annealed layer 140. For example, amorphous layer 130 can be annealed at 600° C. for 200 sec, or amorphous layer 130 can be annealed at 800° C. for 20 sec. In some embodiments, annealed layer 140 becomes a crystalline layer. In some embodiments, annealed layer 140 merges with substrate 102 when the implanted material is the same as that of substrate 102. In some embodiments, annealed layer 140 becomes a doped crystalline layer.

In some embodiments, annealing can be done by one or more heating processes. For example, annealing can be done by RTA, flash lamp heating, laser heating, magnetic heating, resistive heating, inductive heating, and/or any other suitable method of annealing.

Referring to FIG. 4, patterned device 400 is similar to patterned device 100 of FIG. 1. FIG. 4 illustrates patterned device 400, according to an exemplary embodiment. Patterned device 400 includes selective epitaxial layer 150 in channel hole 120. Selective epitaxial layer 150 is formed in channel hole 120 by epitaxy. For example, selective epitaxial layer 150 can be formed by SEG. As discussed above, annealed layer 140 repairs and/or reduces substrate lattice damage in substrate 102 and provides a seed layer to grow selective epitaxial layer 150 in channel hole 120. Further, selective epitaxial layer 150 reduces current leakage in patterned device 400 by encouraging uniform epitaxial growth in channel hole 120.

In some embodiments, selective epitaxial layer 150 can be an epitaxial grown semiconductor layer. For example, selective epitaxial layer 150 can be epitaxial silicon, silicon germanium, germanium, III-V compound material, II-VI compound material, organic semiconductor material, and/or other suitable semiconductor materials. In some embodiments, selective epitaxial layer 150 can be single-crystalline.

Figure 5:
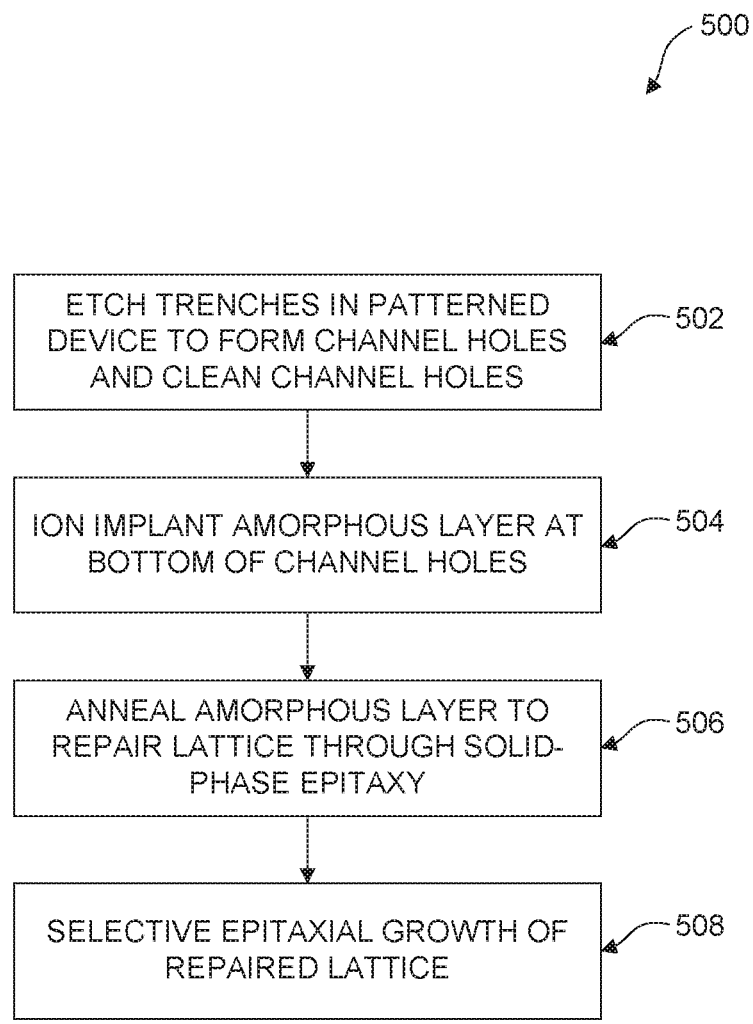
FIG. 5 illustrates a processing flow diagram to fabricate a patterned device with a repaired substrate lattice, according to some embodiments.

FIG. 5 illustrates flow diagram 500 for repairing and/or reducing substrate lattice damage, accordingly to an exemplary embodiment. It is to be appreciated that not all steps in FIG. 5 may be needed to perform the disclosure provided herein. Further, some of the steps may be performed simultaneously, or in a different order than shown in FIG. 5. Flow diagram 500 shall be described with reference to FIG. 5. However, flow diagram 500 is not limited to those example embodiments.

In step 502, as shown in the example of FIG. 1, channel holes 120 with seed window areas 122 are formed or etched in patterned device 100 and then cleaned. Channel hole 120 extends through top insulating layer 108, alternating insulating layer 110, intermediate insulating layer 116, second bottom insulating layer 106, and first bottom insulating layer 104 to expose substrate 102. First bottom insulating layer 104 is formed atop substrate 102. Second bottom insulating layer 106 is formed atop first bottom insulating layer 104. Intermediate insulating layer 116 is formed atop second bottom insulating layer 106. Alternating insulating layer 110 is formed atop intermediate insulating layer 116. Alternating insulating layer 110 can include first patterned insulating layer 112 and second patterned insulating layer 114 in a vertically alternating stacked pattern. As shown in FIG. 1, patterned device 100 can additionally include top insulating layer 108. Top insulating layer 108 is disposed atop alternating insulating layer 110. In some embodiments, patterned device 100 can include a plurality of channel holes 120. In some embodiments, channel hole 120 can be formed by etching. For example, channel hole 120 can be formed by anisotropic ME. In some embodiments, the etching of top insulating layer 108, alternating insulating layer 110, intermediate insulating layer 116, second bottom insulating layer 106, and/or first bottom insulating layer 104 can be performed in one etching process or different etching processes. For example, the etching processes can be plasma processes, for example, RIE using oxygen-based plasma. In some embodiments, ME process can include etchant gas, for example, $CF_4$, $SF_6$, $CHF_3$, and/or other suitable gases. Numerous other etching methods can also be suitable. In some embodiments, channel hole 120 can be formed by using a mask, for example, a photoresist mask that can be patterned, and etching portions top insulating layer 108, alternating insulating layer 110, intermediate insulating layer 116, second bottom insulating layer 106, and/or first bottom insulating layer 104 exposed by the patterned mask using a suitable etching process, e.g., dry etch. In some embodiments, damaged layer 117 is formed in the top side of substrate 102 due to lattice damage in the etching process. In some embodiments, channel hole 120 can be through top insulating layer 108, alternating insulating layer 110, intermediate insulating layer 116, second bottom insulating layer 106, and/or first bottom insulating layer 104 and substantially into substrate 102. The mask can be removed after channel hole 120 is formed. In some embodiments, channel hole 120 can undergo SEG pre-cleaning to clean the native oxide and damaged layer 117 from the previous etching process. For example, HCl etching, HF etching, BOE, BHF etching, or plasma etch cleaning can be used to remove the native silicon oxide layer and any broken silicon grains.

In step 504, as shown in the example of FIG. 2, amorphous layer 130 is deposited. For example, as shown in FIG. 2, amorphous layer 130 can be ion implanted into damaged layer 117 of FIG. 1 below channel hole 120. In some embodiments, amorphous layer 130 can be ion implanted into substrate 102. For example, amorphous layer 130 can be shallow ion implanted into substrate 102. For example, amorphous layer 130 can be deep ion implanted into substrate 102. In some embodiments, implanted material includes one or more of III element, IV element, V element, and inert element. For example, implanted material can be one or more of silicon, carbon, boron, phosphorus, germanium, and argon. In some embodiments, carbon is implanted into substrate 102 to form amorphous layer 130 and to reduce stress. In some embodiments, one or more of III element and V element is implanted into substrate 102 to form amorphous layer 130 and to improve electrical performance. In some embodiments, the material can be implanted with an implant energy of 25 keV to 250 keV. In some embodiments, total dosage of the implantation is higher than $5 \times 10^{15}$ ion/cm$^3$. In some embodiments, implant temperature is −100° C. to 23° C. In some embodiments, the implant process includes multiple sub-processes. For example, the implant process includes a first sub-process and a second sub-process. For example, in the first sub-process, one or more of III element is implanted with a comparatively lower energy, and in the second sub-process, one or more of V element is implanted with a comparatively higher energy.

In step 506, as shown in the example of FIG. 3, amorphous layer 130 is annealed or heated to form annealed layer 140 (also known as crystallized layer). Annealed layer 140 is the result of annealing amorphous layer 130, for example, by RTA. In some embodiments, amorphous layer 130 can be annealed at 600° C. to 800° C. for 20 sec to 200 sec to form annealed layer 140. For example, amorphous layer 130 can be annealed at 600° C. for 200 sec, or amorphous layer 130 can be annealed at 800° C. for 20 sec. In some embodiments, annealed layer 140 becomes a crystalline layer. In some embodiments, annealed layer 140 merges with substrate 102 when the implanted material is the same as that of substrate 102. In some embodiments, annealed layer 140 becomes a doped crystalline layer. In some embodiments, annealing can be done by one or more heating processes. For example, annealing can be done by RTA, flash lamp heating, laser heating, magnetic heating, resistive heating, inductive heating, and/or any other suitable method of annealing.

In step 508, as shown in the example of FIG. 4, selective epitaxial layer 150 is formed in channel hole 120 by epitaxy. For example, selective epitaxial layer 150 can be formed by SEG. As discussed above, annealed layer 140 repairs and/or reduces substrate lattice damage in substrate 102 and provides a seed layer to grow selective epitaxial layer 150 in channel hole 120. Further, selective epitaxial layer 150 reduces current leakage in patterned device 400 by encouraging uniform epitaxial growth in channel hole 120. In some embodiments, selective epitaxial layer 150 can be an epitaxial grown semiconductor layer. For example, selective epitaxial layer 150 can be epitaxial silicon, silicon germanium, germanium, III-V compound material, II-VI compound material, organic semiconductor material, and/or other suitable semiconductor materials. In some embodiments, selective epitaxial layer 150 can be single-crystalline.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A patterned device comprising:
a substrate;
an alternating conductor and dielectric stack atop the substrate;
a channel hole extending through the alternating conductor and dielectric stack to a top surface of the substrate; and
an epitaxial grown layer at a bottom of the channel hole and the top surface of the substrate,
wherein a part of the substrate in contact with the epitaxial grown layer has a dopant or doping concentration different from an adjacent part of the substrate,
wherein the alternating conductor and dielectric stack comprises a plurality of alternating conductor and dielectric layers,
wherein the top surface of the substrate is substantially flat, and
wherein the patterned device comprises a three-dimensional NAND memory device.

2. The patterned device of claim 1, wherein the dopant of the part of the substrate in contact with the epitaxial grown layer comprises one or more elements from groups III, IV, and V.

3. The patterned device of claim 1, wherein the dopant of the part of the substrate in contact with the epitaxial grown layer comprises one or more of silicon, carbon, boron, phosphorus, and germanium.

4. A patterned device comprising:
a substrate;
a stack disposed on the substrate;
a channel hole extending through the stack to a top surface of the substrate; and
an epitaxial grown layer at a bottom of the channel hole and disposed on the top surface of the substrate,
wherein the epitaxial grown layer comprises an annealed crystalline layer configured to repair lattice damage to the substrate,
wherein the stack comprises an alternating conductor and dielectric stack,
wherein the alternating conductor and dielectric stack comprises a plurality of alternating conductor and dielectric layers,
wherein the top surface of the substrate is substantially flat, and
wherein the patterned device comprises a three-dimensional NAND memory device.

5. The patterned device of claim 4, wherein a part of the substrate in contact with the epitaxial grown layer has a dopant or doping concentration different from an adjacent part of the substrate.

6. The patterned device of claim 4, wherein the substrate comprises silicon, silicon germanium, silicon carbide, silicon on insulator (SOI), germanium on insulator (GOI), glass, gallium nitride, gallium arsenide, or an element from group III, IV, or V.

7. The patterned device of claim 4, wherein the alternating conductor and dielectric stack comprises silicon oxide, silicon nitride, silicon oxynitride, organosilicate glass, or spin-on-glass (SOG).

8. A patterned device comprising:
a substrate;
an isolating layer disposed on the substrate;
a channel hole extending through the isolating layer to a top surface of the substrate; and
an epitaxial grown layer at a bottom of the channel hole and disposed on the top surface of the substrate,
wherein the isolating layer comprises an alternating conductor and dielectric stack,
wherein the alternating conductor and dielectric stack comprises a plurality of alternating conductor and dielectric layers,
wherein the top surface of the substrate is substantially flat, and
wherein the patterned device comprises a three-dimensional NAND memory device.

9. The patterned device of claim 8, wherein the epitaxial grown layer comprises an annealed crystalline layer configured to reduce lattice damage to the substrate.

10. The patterned device of claim 8, wherein the epitaxial grown layer is configured to reduce current leakage in the patterned device.

11. The patterned device of claim 8, wherein the epitaxial grown layer comprises a single crystalline silicon.

12. The patterned device of claim 8, wherein the epitaxial grown layer is formed from an amorphous layer.

13. The patterned device of claim 8, wherein the epitaxial grown layer is formed from an annealed amorphous layer.

14. The patterned device of claim 8, wherein the channel hole comprises a seed window area.

* * * * *